United States Patent [19]

Dingwall

[11] Patent Number: 4,521,703
[45] Date of Patent: Jun. 4, 1985

[54] HIGH SPEED SENSE AMPLIFIER

[75] Inventor: Andrew G. F. Dingwall, Bridgewater, N.J.

[73] Assignee: RCA Corporation, Princeton, N.J.

[21] Appl. No.: 412,807

[22] Filed: Aug. 30, 1982

[51] Int. Cl.³ .................. H03K 5/24; H03K 3/353
[52] U.S. Cl. ................................ 307/530; 307/355; 307/279
[58] Field of Search .............. 307/279, 530, 355, 356; 365/182, 190, 205, 208

[56] References Cited

U.S. PATENT DOCUMENTS

| | | | |
|---|---|---|---|
| 4,031,522 | 6/1977 | Reed et al. | 307/530 |
| 4,166,225 | 8/1979 | Minkov et al. | 307/279 |
| 4,430,580 | 2/1984 | Lovelace | 307/279 |

Primary Examiner—John Zazworsky
Attorney, Agent, or Firm—Joseph S. Tripoli; George E. Haas; Henry I. Schanzer

[57] ABSTRACT

A differential stage is combined with a common gate stage to provide increased small signal gain. The components of the two stages are also cross-coupled to provide regenerative feedback.

10 Claims, 4 Drawing Figures

HIGH SPEED SENSE AMPLIFIER

This invention relates to a sense circuit suitable for use with a semiconductor memory.

A significant problem in the design of a large scale, high density, high speed, Read-Only-Memory (ROM) or Random-Access-Memory (RAM) is the need, prior to each read cycle, to place the memory and its associated sense amplifiers in a known, balanced, condition to obtain a rapid read-out from cells having small current outputs and/or to reduce the possibility of disturbing the information stored in the memory. To meet this objective, certain nodes and data (bit) lines are precharged to a known voltage before starting to read data out of the memory. In some applications, it is convenient to take as the known voltage one of two operating voltages (e.g. $V_{DD}$ or ground) which are applied to the memory since the operating voltage is readily available. In this case, the input(s) of a sense amplifier connected to the bit lines are also precharged to one of the operating voltages.

A problem with this arrangement is that the input transistors in conventional known sense amplifiers are interconnected to conduct in the common source (emitter) mode and, as a result of the precharge bias, are operated in a region of relatively low gain for small input signals. The response of the amplifier to changes in the input signal is then not rapid and may be of insufficient amplitude to be sensed.

This is best explained by reference to FIG. 4 which shows the source-to-drain current ($I_{DS}$) vs. the drain-to-source voltage ($V_{DS}$) of an N-channel Mosfet for different values of gate-to-source voltage ($V_{GS}$). The operating region of the transistor to the left of a boundary line denoted by the letter A termed the linear region. This is the region where $V_{DS}$ is significantly less that $V_{GS}$. The operating region to the right of curve A where $V_{DS}$ is more nearly equal to or greater than $V_{GS}$, is termed the saturation region. For a given change in gate-to-source voltage ($V_{GS}$) the change in drain-to-source current ($I_{DS}$) is significantly greater for values of $V_{DS}$ to the right of curve A. By way of example, a change in $V_{GS}$ from 5.0 volts to 4 volts (for a given $V_{DS}$) causes a change in output current ($I_{DS}$) of 1.25 ma [amplitude B] when $V_{DS}$ is equal to 3 volts and causes a change in $I_{DS}$ of 0.25 ma [amplitude C] when $V_{DS}$ is equal to 0.5 volts. Thus there is a relative change in current gain of 5 to 1 depending on whether operation is in the saturation region or deep in the linear region. Similarly for a given change $\Delta V_{GS}$ in $V_{GS}$ (for a given $I_{DS}$), the change in the output voltage ($V_{DS}$) is approximately 1.5 volts [amplitude D] in the saturation region versus approximately 0.3 volts [amplitude E] in the linear region. Thus, the current and voltage gains of a transistor vary as a function of its $V_{DS}$. Following a line of constant $V_{GS}$ it is seen that the change in voltage and current gain is gradual being very low (actually zero at $V_{DS}=0$) for low values of $V_{DS}$ deep in the linear region and increasing with increasing $V_{DS}$ until at the knee of the curve near the boundary line A the gain reaches a relatively constant value relatively independent of further increase in $V_{DS}$.

In circuits embodying the invention, the gain of a sense amplifier is increased by connecting a common gate stage across the outputs of a differential stage and operating the transistors forming the common gate stage in the saturation region or in the linear region close to the saturation region to increase the gain of the amplifier.

Circuits embodying the invention include means for combining a differential stage with a common gate stage and cross coupling components of the two stages to also provide regenerative feedback.

A particular sense amplifier embodying this invention includes a differential amplifier section coupled at its first and second inputs to first and second input lines and having first and second differential outputs. The circuit further includes a first transistor having its conduction path connected between the first line and the second output with its control electrode connected to the first differential output and a second transistor having its conduction path connected between the second line and the first differential output with its control electrode connected to the second differential output.

In the accompanying drawing like reference characters denote like components; and FIG. 1 is a schematic diagram of a circuit embodying the invention;

Figure 1:
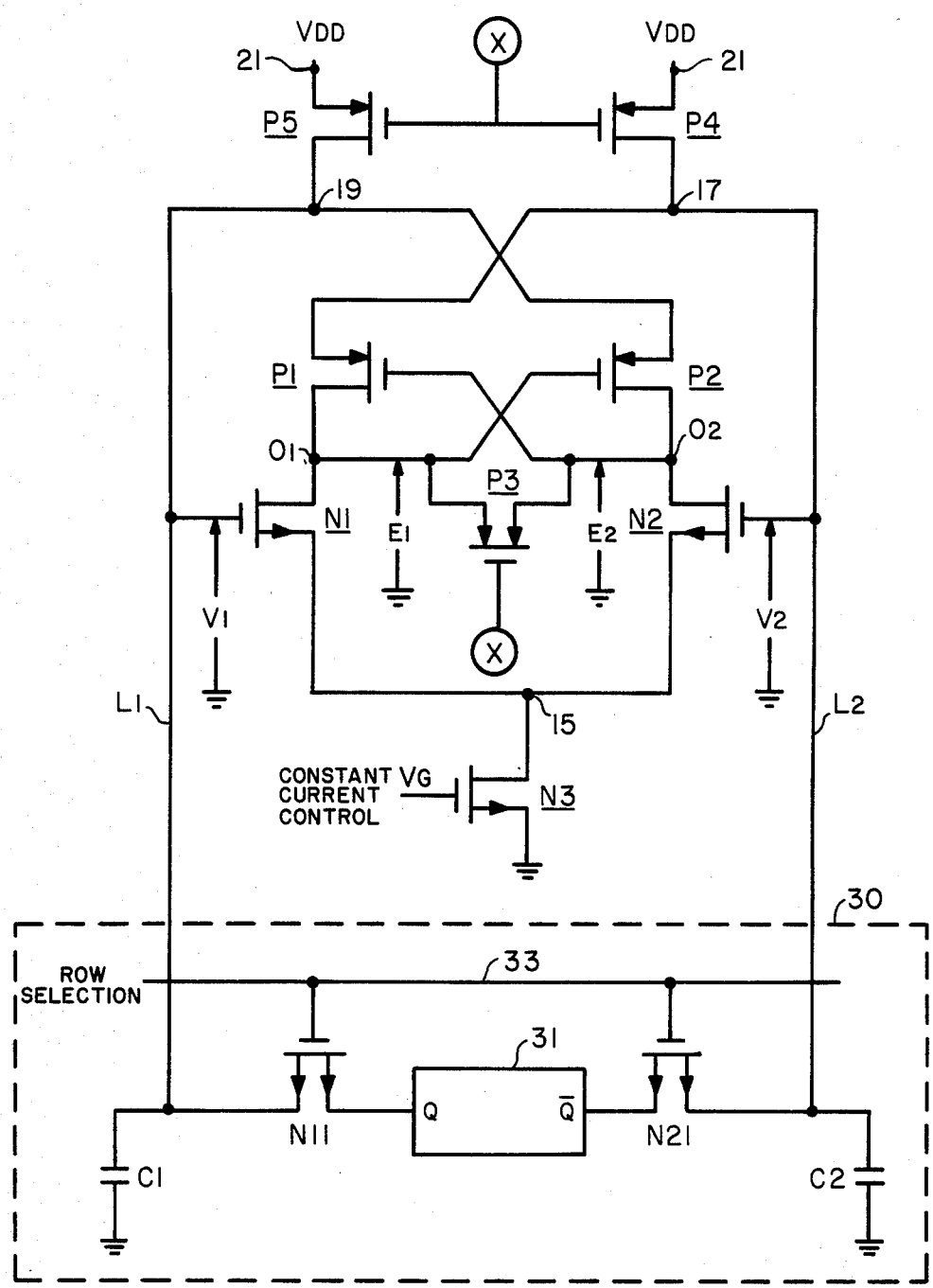

In the discussion to follow, insulated-gate field-effect transistors (IGFETs) are used to illustrate the invention. IGFETs of P conductivity are denoted by the letter P followed by a particular reference character and IGFETs of N conductivity are denoted by the letter N followed by a particular reference character.

The sense circuit shown in FIG. 1 includes differentially connected insulated-gate field-effect transistors (IGFETs) N1 and N2 connected at their gate electrodes to bit lines L1 and L2, respectively. The source electrodes of N1 and N2 are connected to a common source node 15 while their drains are respectively connected to differential output terminals 01 and 02. The source-to-drain path of a transistor N3 is connected between node 15 and ground. A signal $V_G$ is applied to the gate of N3 to selectively turn-on N3 and cause it to conduct a relatively constant current.

The source-to-drain path of an IGFET P1 is connected between the drain of N1 and a node 17 to which is connected line L2 and the drain of a precharge transistor P4. The source-to-drain path of an IGFET P2 is connected between the drain of N2 and a node 19 to which is connected line L1 and the drain of a precharge transistor P5. The gate electrode of P1 is connected to output terminal 02 and the gate electrode of P2 is connected to output terminal 01.

The source electrodes of P4 and P5 are connected to a terminal 21 to which is applied an operating potential of $V_{DD}$ volts which is positive with respect to ground. The source-to-drain path of an IGFET P3 is connected between differential output terminals 01 and 02. A precharge signal labelled X is applied to the gate electrodes of IGFETs P3, P4 and P5.

One memory cell of an array 30 of cells is shown connected between bit lines L1 and L2. The memory cell includes a storage element 31, which may be any one of a number of static or dynamic cells having complementary input/output terminals (Q and $\overline{Q}$) at which are produced complementary signals. The Q and $\overline{Q}$ input/output terminals are coupled via selection transistor N11 and N21 to bit lines L1 and L2, respectively. The gate electrodes of N11 and N21 are connected to a row selection line 33. When a potential of $+V_{DD}$ volts is applied to line 33, N11 and N21 are turned-on and the contents of the memory cell are then read out onto the bit lines. The distributed bit line capacitances associated with lines L1 and L2 are shown as C1 and C2, respectively.

Figure 2:
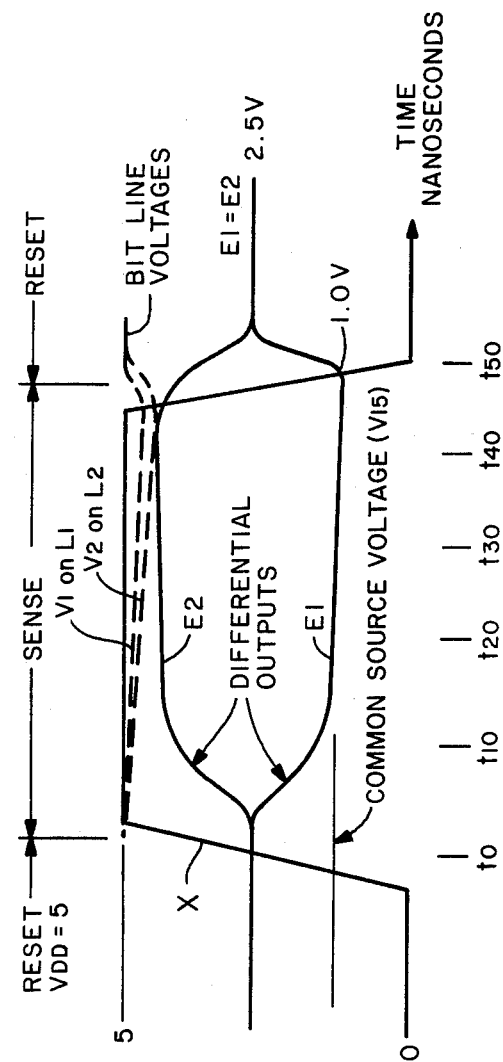
FIG. 2 is a diagram of waveforms associated with the circuit of FIG. 1.

The operation of the circuit of FIG. 1 may be best understood by first examining the precharge operation which occurs when the precharge pulse (X) is initially at, or close to, zero volts ("low"). When X is low, as shown in FIG. 2 for times before $t_o$, transistors P3, P4 and P5 are turned-on hard. The turn-on of P4 and P5 charges lines L1 and L2 to $V_{DD}$ volts and applies $V_{DD}$ volts to the sources of P1 and P2. P4 and P5 are preferably made larger than P1 and P2 but this is not essential.

Figure 4:
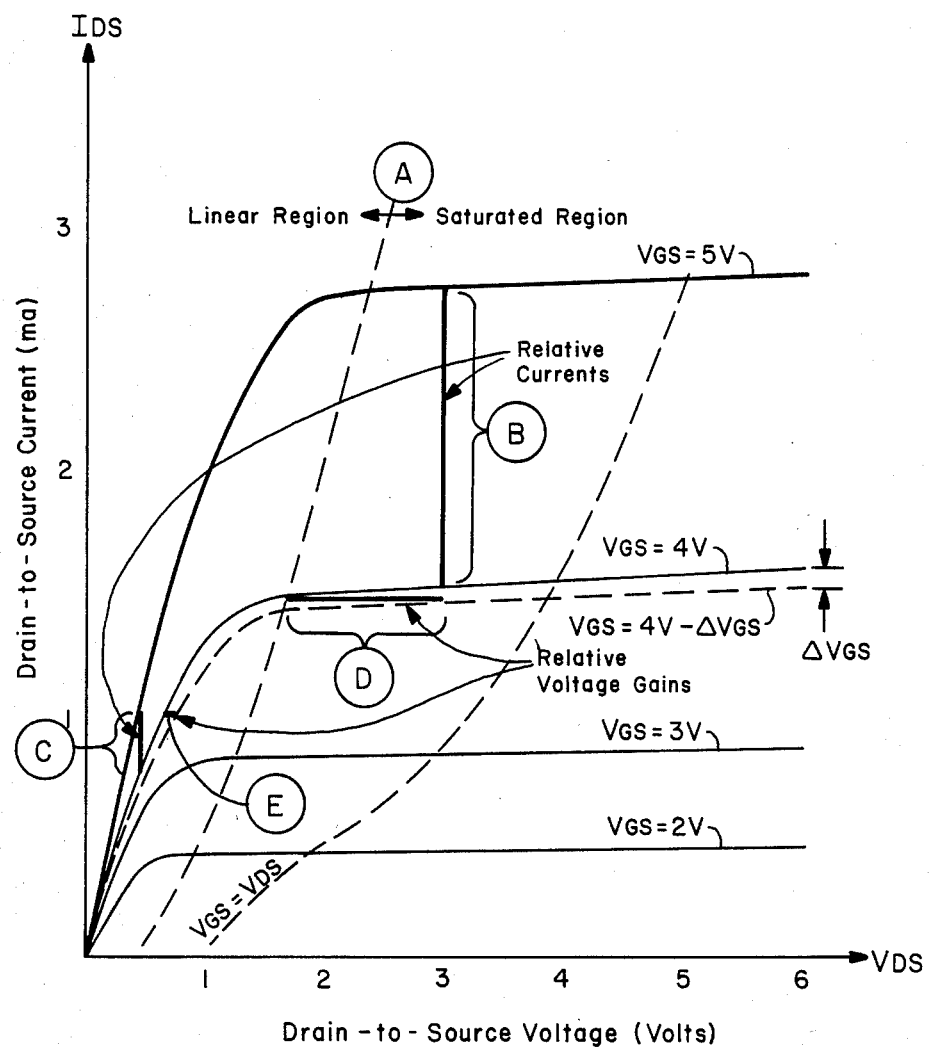
FIG. 4 is a diagram of the drain-to-source current ($I_{DS}$) of an N-channel MOSFET versus drain-to-source voltage ($V_{DS}$) for different values of gate-to-source potential ($V_{GS}$).

The turn-on of P3 causes the voltages E1 and E2 at output terminals 01 and 02, respectively, to be driven to substantially the same value. The turn-on of P3 also provides respective low impedance conduction paths between the gate and drain of P1 and the gate and drain of P2. Assume also that a positive voltage $V_G$ is applied to the gate of N3 turning-it-on. With N3 turned-on, N1 and N2, with $V_{DD}$ volts applied to their gate electrodes, are also turned-on and conduct. Since P4 and P5 are turned-on hard (and since P4 and P5 are large devices) the full $V_{DD}$ potential is applied to L1 and L2 and to the source electrodes of P1 and P2. Assume still further, for ease of discussion, that the source-to-drain impedances of P1, P2, N1, N2, and N3 are designed to be such that, when X is at zero volts and P4, P5, and P3 are turned-on hard, that E1 and E2 are initially set at $V_{DD}12$ volts. For $V_{DD}=5$ volts, E1 and E2 are then initially assumed to be at 2.5 volts and the common source voltage $(V_{15})$ at node 15 is assumed to be at 1.5 volts. For this bias condition, note that the $V_{GS}$ of N1 and N2 is 3.5 volts while their $V_{DS}$ is 1 volt. Hence N1 and N2 are being operated deep in the linear region. That is, well to the left of the $V_{DSAT}$ curve (A) in FIG. 4.

The precharge period ends and the sense period begins when the precharge pulse, X, goes from zero volts to, or close to, $V_{DD}$ volts (high), at a time close to $t_o$ as shown in FIG. 2. When X goes high, transistors P3, P4 and P5 are turned-off. The turn-off of P4 and P5 removes the low impedance paths coupling the bit lines to $V_{DD}$. The turn-off of P4 and P5 removes the connection between the $V_{DD}$ source at node 21 and the sense amplifier at the onset of the sense cycle. A feature of disconnecting P4 and P5 is that when sensing occurs, no current is drawn from $V_{DD}$. This avoids a problem encountered in known sense circuits which draw relatively large currents when initially connected to a signal source and cause relatively large transients to be generated within the system.

With P4 and P5 turned-off, transistors P1 and P2 now function as the means for supplying current to the differential amplifier section (N1, N2, N3) and, in fact, supply this current from the bit line capacitances.

Due to the bit line capacitances $C_1$ and $C_2$ and output terminal capacitances (not shown) it is assumed that after the end of precharge, E1 and E2 remain at $V_{DD}/2$ and that lines L1 and L2 remain at $V_{DD}$ volts until the application of a signal across lines L1 and L2. Signals are applied to lines L1 and L2 when a row selection signal is applied to row conductor 33 turning on selection transistors N11 and N21 and causing the outputs Q and $\overline{Q}$ of memory cell 31 to be coupled via the conduction paths of transistors N11 and N21 to bit lines L1 and L2, respectively. (Typically the row selection signal is generated concurrently with X going high.) For purpose of explanation, assume that Q is "high" being at, or close to, $V_{DD}$ volts and $\overline{Q}$ is "low" being at, or close to, zero, volts. With Q-high and L1 charged to $V_{DD}$ volts, transistor N11, although turned-on, will, initially, not pass any current, since the two ends of its conduction path are at $V_{DD}$ volts. In fact, N11 will not conduct until the voltage on L1 decreases to one threshold voltage drop $(V_T)$ below the gate voltage of N11. With $\overline{Q}$ low and L2 at $V_{DD}$ volts, transistor N21 conducts in the common source mode and passes current in a direction to discharge line L2 to the $\overline{Q}$ potential which is ground [via a relatively low impedance conduction path (not shown) between $\overline{Q}$ and ground]. Hence, line L1 which was charged to $V_{DD}$ volts remains at or close to $V_{DD}$ volts, while line L2 which was initially charged to $V_{DD}$ volts is being discharged via N21 towards the $\overline{Q}$ or ground potential.

Although the voltage V1 on line L1 decreases slightly with time, it may be assumed that V1 remains at $V_{DD}$ during the early stages of sensing. In any case, as shown in FIG. 2, for the condition of Q-high and $\overline{Q}$ low, the potential (V2) on L2 decreases significantly more than, and faster than, the potential (V1) on L1. With V1 greater than V2, N1 conducts more heavily than N2 causing the voltage level (E1) at 01 to decrease such that E1 goes below $V_{DD}/2$ while the voltage level (E2) at 02 increases such that E2 goes above $V_{DD}/2$. Clearly the input voltage differential $\Delta V$ (which is equal to V1−V2), is multiplied by the gain of the differential stage. However, note that N1 and N2 of the differential stage are operated deep in the linear region of their transfer characteristics. Hence the voltage gain of the differential stage is low. For example, the gate electrodes of N1 and N2 are at, or close to, 5 volts, while their drains are close to 2.5 volts and their sources are at approximately 1 volt. Thus their $V_{GS}$ may be 3.5 volts while their $V_{DS}$ may be 1.0 volts. Hence at the beginning of the sense cycle, the voltage gain of transistors N1 and N2 is not very high although typically of the order of unity, or somewhat greater, depending upon the geometry and current levels. Thus, differentially connected transistors N1 and N2 conduct in the common source mode, sense a voltage differential (V1−V2), and provide limited although useful signal amplification.

Increased signal amplification is obtained with the addition of the common gate stage comprising P1 and P2. P1 and P2 with their gate electrodes connected to terminals 02 and 01, respectively, and with their source electrodes connected to L2 and L1, respectively, are operated in a hybrid type of common gate mode. The signals on the bit lines are applied as input signals to the source electrodes of transistors P1 and P2 and function in part to vary their conductivity. For the example above (Q high and $\overline{Q}$-low), P1 with its gate connected to 02 whose voltage E2 is increasing (since conduction through N2 is decreasing) and with its source connected to L2 whose voltage is decreasing, is being turned-off in two ways. One, its source voltage is being decreased, and two, its gate voltage is being increased. The gate-to-source potential $(V_{GS})$ of P1 is thus quickly and substantially decreased. Since P1 is being turned-off, it tends to isolate terminal 01 from bit line L2, and N1 which is being turned-on harder than N2 can discharge the capacitance associated with terminal 01 faster.

Concurrently, P2, with its gate connected to 01 whose voltage E1 is decreasing, is being turned-on hard and couples the voltage on line L1 to 02 via its source-to-drain path. Since N2 is being turned-off it draws very little, if any, current out of 02 and 02 is driven from $V_{DD}/2$ towards $V_{DD}$ via the source-to-drain path of P2.

Transistors P1 and P2 are initially biased such that their $V_{DS}$ is equal to their $V_{GS}$ which is equal to $V_{DD}/2$. Thus transistors P1 and P2 are biased to operate in a region well to the right of boundary line A in FIG. 4 where increased voltage and current gains of the transistors are obtained. The amplification provided by P1 and P2 adds to the gain provided by N1 and N2 ensuring a significantly more rapid response and one of greater magnitude at the differential output terminals.

The conduction of P1 and P2 is a modulated, or modified, form of common gate conduction. P1 and P2, with their gates initially at $V_{DD}/2$, conduct a current between their source and drain electrodes which is a function of the source voltage. However their gate voltage is modulated by the differential section so that their conduction is a function of the change at their source and at their gate. Hence the conduction mode of P1 and P2 may be characterized as a modulated or hybrid common gate mode. Evidently, P1 and P2 function to amplify the signals on lines L1 and L2 in parallel with the differential stage (N1, N2, N3).

In addition to the differential (common source) and common gate gain modes, the gate electrodes of P1 and P2 are cross coupled to the drains of N2 and N1, respectively, to provide regenerative feedback. As E2 increases, conduction through P1 decreases enabling the potential at 01 to decrease. The decrease in E1 causes increased conduction through P2, increasing the potential at 02 and further decreasing conduction through P1. N1 can thus very quickly discharge the nodal capacitance at 01, while P2 functions to quickly charge up the nodal capacitance at 02.

A feature of the circuit of FIG. 1 is that the data on the bit lines control the extent of the regenerative feedback. This is in contrast to known sense amplifiers where the sources of P1 and P2 are returned to $V_{DD}$. In the known sense amplifiers the cross-coupled load may in response to a transient on the line, initiate a regenerative cycle setting the output of a sense amplifier to a condition other than that actually read out of the memory. Coupling the sources of P1 and P2 to the sense lines ensures that the information on the sense line always controls the state to which the cross-coupled transistors drive the sense amplifier outputs.

Note that the bit line voltages change very little before the state of the input is sensed and a reliable output of relatively large amplitude is produced. Computer simulation of the circuit indicates that a differential output of 1 volt can be produced in response to a differential input signal of 50 millivolts within 10 to 15 nanoseconds of the application of the input signal across the bit lines.

It has thus been shown that the circuit of FIG. 1 includes 3 different gain mechanisms to enable the rapid sensing of a small differential input signal.

Figure 3:
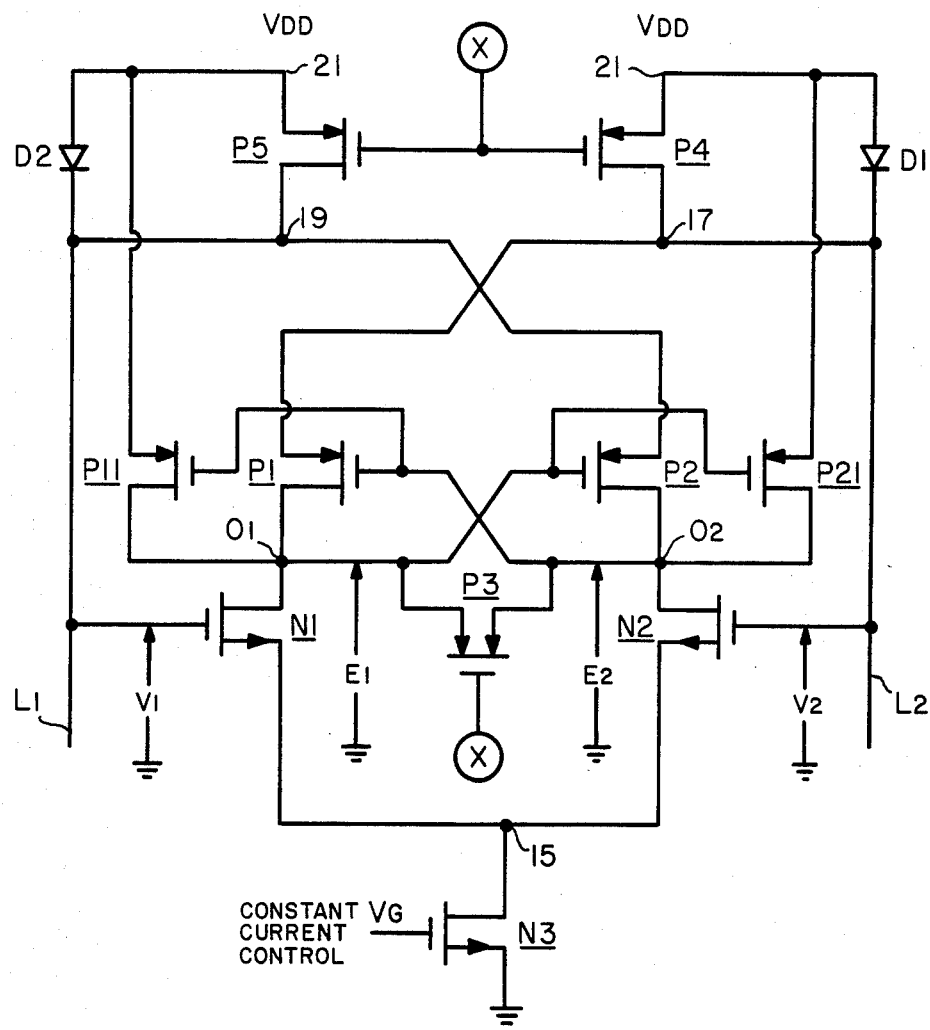
FIG. 3 is another schematic diagram of a circuit embodying the invention.

The circuit of FIG. 3 is similar to that of FIG. 1 with the addition of diodes D1 and D2 and transistors P11 and P21. Diode D1 is connected between node 21 and line L2 and diode D2 is connected between node 21 and line L1. Diodes D1 and D2 prevent lines L1 and L2 from discharging to a voltage which is less than one diode forward voltage drop ($V_F$) below $V_{DD}$. The diodes by preventing a large voltage drop on the bit lines help improve the recovery of the amplifier to the precharge condition after a sense cycle. The diodes are an example of pull-up devices connected between the bit lines and $V_{DD}$. The diodes could be replaced by resistors, transistors connected as diodes, or active transistors designed to couple the bit lines back to $V_{DD}$ if the bit line voltage dropped below a predetermined level. The diodes, or like pull-up elements, allow the final levels at 01 and 02 to be centered around $V_{DD}/2$ which is a convenient level for conventional detection by circuitry (not shown) connected to 01 and 02. Thus the use of the diodes ensures static sense amplifier action if the sense period extends for a considerable period of time (i.e. a period substantially in excess of 50 nanoseconds).

Transistor P11 is connected at its source to node 21, at its gate to output 02, and at its drain to output 01. P21 is connected at its source to node 21, at its gate to output 01, and at its drain to output 02.

As discussed above, there is some droop associated with both bit lines during the sense mode. The droop of the bit line to which a logic "0" is applied is more pronounced than the droop of the bit line to which a "one" or "high" level signal is applied. Transistors P11 and P21 provide an alternate or supplemental means of coupling a hard $V_{DD}$ level to the output of the sense amplifier whose input was low. P11 and P21 are relatively small, high impedance devices compared to P1 and P2 whereby P11 and P21 do not control amplifier action until after the output levels are well defined.

What is claimed is:

1. In combination with a differential stage having first and second inputs adapted to receive complementary input signals and having first and second differential outputs, the improvement comprising:
    first and second transistors, each transistor having first and second electrodes defining the ends of a conduction path and a control electrode;
    means connecting the conduction path of said first transistor between said first input and said second differential output;
    means connecting the conduction path of said second transistor between said second input and said first differential output;
    means connecting the control electrode of said first transistor to said first differential output; and
    means connecting the control electrode of said second transistor to said second differential output.

2. The combination as claimed in claim 1 wherein said first and second transistors are insulated-gate field-effect transistors (IGFETs) of first conductivity type and wherein said differential stage includes a third and a fourth IGFET of second conductivity type; each one of said IGFETs having a conduction path and a control electrode for controlling the conductivity of its conduction path;
    wherein the conduction path of said third IGFET is connected between said first differential output and a common node;
    wherein the conduction path of said fourth IGFET is connected between said second differential output and said common node; and
    wherein the control electrode of said third IGFET is connected to said first input, and the control electrode of said fourth IGFET is connected to said second input.

3. A sense amplifier comprising:

first and second lines adapted to receive complementary information;

first and second transistors of first conductivity type, and third and fourth transistors of second conductivity type; each transistor having first and second electrodes defining the ends of a conduction path and a control electrode;

means connecting the control electrode of said first transistor to said first line and the control electrode of said second transistor to said second line;

a current conducting means connected between the first electrodes of said first and second transistors and a first point of operating potential;

means connecting the control electrode of said third transistor and the second electrode of said fourth transistor to the second electrode of said second transistor;

means connecting the control electrode of said fourth transistor and the second electrode of said third transistor to the second electrode of said first transistor; and means connecting the first electrode of said fourth transistor to said first line and the first electrode of said third transistor to said second line.

4. The sense amplifier as claimed in claim 3 further including fifth and sixth transistors of said second conductivity type, said fifth and sixth transistors having their conduction paths connected between said first and second lines, respectively, and a second point of operating potential.

5. The sense amplifier as claimed in claim 4, further including a seventh transistor of said second conductivity type having its conduction path connected between the second electrodes of said first and second transistors; and means for applying a signal to the control electrodes of said fifth, sixth and seventh transistors for selectively turning said transistors on or off.

6. The sense amplifier as claimed in claim 5 wherein said current conduction means includes an eighth transistor having a conduction path and a control electrode for controlling its conductivity, and wherein its conduction path is connected at one end to the first electrodes of said first and second transistors and at its other end to said first point of operating potential.

7. The combination as claimed in claim 6 further including first and second diodes, said first diode being connected between said second point of operating potential and said first line and said second diode being connected between said second point of operating potential and said second line, said first and second diode being poled to conduct in the same direction as said fifth and sixth transistors.

8. The combination as claimed in claim 6 further including ninth and tenth transistors, the control electrode of said ninth transistor and the second electrode of said tenth transistor being connected to said second electrode of said second transistor, and the control electrode of said tenth transistor and the second electrode of said ninth transistor being connected to the second electrode of said first transistor; and means connecting the first electrodes of said ninth and tenth transistor to said second point of operating potential.

9. In combination with a differential stage having a linear region and being biased to operate in said linear region, said differential stage having first and second inputs adapted to receive complementary input signals and having first and second differential outputs, the improvement comprising:

a common gate stage biased to operate in the saturation region or in the linear region close to the saturation region, said common gate stage being responsive to the signals applied between said first and second inputs; and means connecting said common gate stage between said first and second differential outputs.

10. The improvement as claimed in claim 9 wherein said common gate stage includes first and second transistors, each transistor having first and second electrodes defining the ends of a conduction path and a control electrode;

wherein the conduction path of said first transistor is connected between said first differential output and said second input, wherein the conduction path of said second transistor is connected between said second differential output and said first input; and wherein the control electrode of said first transistor is connected to said second differential output, and the control electrode of said second transistor is connected to said first differential output.

* * * * *

UNITED STATES PATENT AND TRADEMARK OFFICE
CERTIFICATE OF CORRECTION

PATENT NO. : 4,521,703

DATED : Jun. 4, 1985

INVENTOR(S) : Andrew G. F. Dingwall

It is certified that error appears in the above-identified patent and that said Letters Patent is hereby corrected as shown below:

Col. 1, line 36, change "A" to - - - Ⓐ is - - -.
Col. 1, line 38, change "A" to - - - Ⓐ - - -.
Col. 1, line 61, change "A" to - - - Ⓐ - - -.
Col. 3, line 34, change "$V_{DD}12$" to - - - $V_{DD}/2$ - - -.

Signed and Sealed this

Twenty-ninth Day of October 1985

[SEAL]

Attest:

DONALD J. QUIGG

Attesting Officer

Commissioner of Patents and Trademarks—Designate